US008187415B2

(12) United States Patent
Kim et al.

(10) Patent No.: US 8,187,415 B2
(45) Date of Patent: *May 29, 2012

(54) PLASMA ETCH REACTOR WITH DISTRIBUTION OF ETCH GASES ACROSS A WAFER SURFACE AND A POLYMER OXIDIZING GAS IN AN INDEPENDENTLY FED CENTER GAS ZONE

(75) Inventors: Jong Mun Kim, San Jose, CA (US); Jingbao Liu, Sunnyvale, CA (US); Bryan Y. Pu, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 525 days.

This patent is subject to a terminal disclaimer.

(21) Appl. No.: 11/490,936

(22) Filed: Jul. 21, 2006

(65) Prior Publication Data

US 2007/0247075 A1 Oct. 25, 2007

Related U.S. Application Data

(60) Provisional application No. 60/793,785, filed on Apr. 21, 2006.

(51) Int. Cl.
*H01L 21/205* (2006.01)
*H01L 21/28* (2006.01)
(52) U.S. Cl. .............................. 156/345.44; 118/723 VE
(58) Field of Classification Search ............... 118/723 E; 156/345.43, 345.44, 345.45, 345.46, 345.47; 315/111.21

See application file for complete search history.

(56) References Cited

U.S. PATENT DOCUMENTS

| 5,685,942 A | 11/1997 | Ishii | 156/345.48 |
| 5,707,486 A * | 1/1998 | Collins | 156/345.49 |
| 5,919,332 A | 7/1999 | Koshiishi et al. | 156/345.47 |
| 5,958,140 A | 9/1999 | Arami et al. | 118/725 |

(Continued)

FOREIGN PATENT DOCUMENTS

JP 05-335239 12/1993

(Continued)

OTHER PUBLICATIONS

Shin-Ichi Imai, "Photoresist selectivity mechanism in $SiO_2$ etching by inductively coupled plasma using fluorocarbon gases", Journal of Vacuum Science and Technology, B20(4), Jul./Aug. (2002), pp. 1482-1488.

(Continued)

*Primary Examiner* — Sylvia R. MacArthur
(74) *Attorney, Agent, or Firm* — Robert M. Wallace

(57) ABSTRACT

A plasma etch reactor for plasma enhanced etching of a workpiece such as a semiconductor wafer includes a housing defining a process chamber, a workpiece support configured to support a workpiece within the chamber during processing and comprising a plasma bias power electrode. The reactor further includes a first process gas inlet coupled to receive predominantly or pure oxygen gas and a second process gas inlet coupled to receive a polymerizing etch process gas. The reactor has a ceiling plasma source power electrode including a center circular gas disperser configured to receive a process gas from the first process gas inlet and to distribute the process gas into the chamber over the workpiece, and an inner annular gas disperser centered around the center gas disperser configured to receive the process gas from the second process gas inlet and to distribute the process gas into the chamber over the workpiece through an inner plurality of injection ports.

9 Claims, 9 Drawing Sheets

U.S. PATENT DOCUMENTS

| | | | |
|---|---|---|---|
| 6,114,258 A | 9/2000 | Miner et al. | 438/787 |
| 6,211,092 B1 | 4/2001 | Tang et al. | 438/719 |
| 6,562,720 B2 | 5/2003 | Thilderkvist et al. | 438/695 |
| 6,624,084 B2* | 9/2003 | Maeda et al. | 438/732 |
| 6,635,185 B2 | 10/2003 | Demmin et al. | 216/64 |
| 6,746,961 B2 | 6/2004 | Ni et al. | 438/700 |
| 6,894,245 B2* | 5/2005 | Hoffman et al. | 219/121.43 |
| 6,998,014 B2 | 2/2006 | Chen et al. | 156/345.34 |
| 7,300,597 B2* | 11/2007 | Chae et al. | 216/66 |
| 2001/0010257 A1 | 8/2001 | Ni et al. | 156/345 |
| 2002/0192369 A1 | 12/2002 | Morimoto et al. | 427/248.1 |
| 2003/0024902 A1 | 2/2003 | Li et al. | 216/67 |
| 2003/0037880 A1* | 2/2003 | Carducci et al. | 156/345.43 |
| 2003/0037881 A1* | 2/2003 | Barnes et al. | 156/345.44 |
| 2003/0232504 A1 | 12/2003 | Eppler et al. | 438/709 |
| 2004/0050325 A1 | 3/2004 | Samoilov et al. | |
| 2004/0083964 A1 | 5/2004 | Ingle et al. | 118/115 |
| 2004/0163764 A1 | 8/2004 | Collins et al. | 156/345.48 |
| 2004/0261712 A1 | 12/2004 | Hayashi et al. | 118/723 E |
| 2005/0022933 A1 | 2/2005 | Howard | 156/345.47 |
| 2005/0051272 A1 | 3/2005 | Collins et al. | 156/345.48 |
| 2005/0077010 A1 | 4/2005 | Goto | 156/345.33 |
| 2005/0090118 A1* | 4/2005 | Shannon et al. | 438/706 |
| 2005/0241762 A1* | 11/2005 | Paterson et al. | 156/345.28 |
| 2006/0000803 A1 | 1/2006 | Koshiishi et al. | |
| 2006/0042754 A1 | 3/2006 | Yoshida et al. | 156/345.1 |
| 2006/0169671 A1 | 8/2006 | Miya et al. | 216/67 |
| 2006/0191637 A1 | 8/2006 | Zajac et al. | |
| 2007/0131652 A1 | 6/2007 | Okune et al. | |
| 2007/0181254 A1* | 8/2007 | Iida et al. | 156/345.28 |
| 2007/0240778 A1 | 10/2007 | L'Bassi et al. | 137/883 |
| 2007/0246162 A1* | 10/2007 | Paterson et al. | 156/345.38 |
| 2007/0247075 A1* | 10/2007 | Kim et al. | 315/111.21 |
| 2007/0249173 A1 | 10/2007 | Kim et al. | 438/711 |
| 2007/0251642 A1 | 11/2007 | Bera et al. | 156/345.26 |
| 2007/0251917 A1 | 11/2007 | Bera et al. | 216/58 |
| 2007/0251918 A1 | 11/2007 | Bera et al. | 216/58 |
| 2007/0254483 A1 | 11/2007 | Bera et al. | 438/689 |
| 2007/0254486 A1 | 11/2007 | Bera et al. | 438/706 |
| 2008/0178805 A1* | 7/2008 | Paterson et al. | 118/723 I |
| 2008/0179011 A1* | 7/2008 | Collins et al. | 156/345.44 |

FOREIGN PATENT DOCUMENTS

| | | |
|---|---|---|
| JP | 06-177-048 | 6/1994 |
| JP | 2000-200772 | 7/2000 |
| JP | 2002-280357 | 9/2002 |
| JP | 2004-200460 | 7/2004 |
| JP | 2005-166827 | 6/2005 |
| JP | 2005-277369 | 10/2005 |
| JP | 2006-041088 | 2/2006 |
| WO | WO 2005/055303 A1 | 6/2005 |

OTHER PUBLICATIONS

Official action dated Nov. 10, 2009 issued in co-pending U.S. Appl. No. 11/414,026.

Official action dated Oct. 14, 2010 issued in co-pending U.S. Appl. No. 11/414,026.

Official Action dated Sep. 14, 2011 issued in co-pending U.S. Appl. No. 11/414,026.

* cited by examiner

PLASMA ETCH REACTOR WITH DISTRIBUTION OF ETCH GASES ACROSS A WAFER SURFACE AND A POLYMER OXIDIZING GAS IN AN INDEPENDENTLY FED CENTER GAS ZONE

CROSS-REFERENCE TO RELATED APPLICATIONS

This application claims the benefit of U.S. Provisional Application Ser. No. 60/793,785, filed Apr. 21, 2006 entitled PLASMA ETCH REACTOR WITH DISTRIBUTION OF ETCH GASES ACROSS A WAFER SURFACE AND A POLYMER OXIDIZING GAS IN AN INDEPENDENTLY FED CENTER GAS ZONE, by Jong Moon Kim, et al.

BACKGROUND OF THE INVENTION

Fabrication of integrated circuits with feature sizes on the order of nanometers requires etch processes that are extremely uniform across the entire surface of a semiconductor wafer, typically about 300 millimeters in diameter. Such uniform etch processes are typically realized in a plasma etch reactor such as a capacitively coupled plasma reactor with an overhead electrode having a high aspect ratio (e.g., an electrode-to-wafer gap of only 2.5 cm for a 300 mm wafer). The etch process gas, which may be a fluorocarbon or fluorohydrocarbon gas, is of the type that forms a protective polymer layer over photoresist or other thin film surfaces that are not to be etched. Such a protective thin film also forms on the opening sidewalls formed during the etch process. Formation of such a protective polymer layer enhances etch selectivity and provide the means for etch profile control.

Such processes exhibit a low etch rate and/or tapered etch profile (due to excess sidewall polymer) at the center of the wafer and a high etch rate at the wafer periphery. Such a nonuniform radial distribution of etch rate and profile across the wafer surface has appeared to be unavoidable for a number of reasons. First, the process gas is introduced either from the side of the wafer or over the top of the wafer. Evacuation of gas from the reactor chamber requires the gas to flow in a radially outward direction across the surface of the wafer, so that gases fed to the wafer center pass over the wafer periphery before being evacuated. Therefore, the residency time of the gas increases with wafer radius, so that the minimum residency time (and hence the minimum gas dissociation) occurs at the wafer center. This effect is particularly pronounced due to the high aspect ratio of the reactor chamber. This aspect ratio arises from the small electrode-to-wafer gap (e.g., about 2 cm) and the large wafer diameter (e.g., 300 mm). The low dissociation of plasma ions at the wafer center results in more complex (e.g., more carbon-rich) fluorocarbon or fluorohydrocarbon plasma species at the wafer center, which tend to etch dielectric material on the wafer more slowly while depositing etch-stopping polymer more quickly on the bottom floors and side walls of the etched openings or structure, thereby depressing the etch rate at the wafer center and tapering the etch profile. In contrast, the high dissociation of plasma ions at the wafer edge produces simpler (more active) etch species that are relatively high in fluorine content (the extreme example of such reactive species being free fluorine) and produce low-carbon content polymer films that accumulate more slowly on photoresist surfaces. At the wafer center, the effect of low dissociation is most noticeable when etching extremely narrow openings through a dielectric thin film. At the wafer center, the polymer accumulates on the side walls of the narrow openings and eventually, as the opening depth increases, pinches off the opening and stops further etching of the opening before the required depth is reached, a phenomenon referred to as etch stop.

These problems are exacerbated when attempting to increase the etch rate by the expedient of increasing the process gas flow rate into the reactor chamber. Such an increase in gas flow rate does not solve the problem of non-uniform residency time across the wafer surface (and hence the non-uniform dissociation across the wafer surface), and may even worsen the problem, thereby worsening the etch rate non-uniformity. One approach to improving the etch rate at the wafer center might seem to be decreasing the process gas flow rate over the wafer center or increasing it at the wafer periphery (or both). However, such a technique is not enough since the polymer composition distribution across the wafer surface is not significantly changed. Thus, there appears to be no solution to the problem.

Another reason for such problems is the process gas content. Such problems have not been pronounced for many processes involving fluorocarbon or hydrocarbon etch process gases in a plasma etch reactor chamber. However, we have found that these problems arise with great severity when using particular combinations of such gases that otherwise produce the best possible process results, such as (for example) a process gas that has, for its etchant component, $C_4F_6+CH_2F_2$. Another example can include $CHF_3$ and/or $CF_4$. These processes gas have been found to produce desired results (with the exception of the tendency for etch stop discussed above) when etching such dielectric materials as silicon dioxide or silicon nitride or low dielectric constant materials such as porous organo-silicate glass or nitrogen-doped silicon-carbon compounds, for example. Using other process gases compromises etch performance when etching such materials as silicon dioxide, silicon nitride, porous organo-silicate glass or nitrogen-doped silicon-carbon compounds. It has seemed that the only way of avoiding center-low etch rate distribution or the related etch stop problems is to employ other (less desirable) process gas mixtures.

Another cause for the center-low etch rate distribution across the wafer surface arises in a particular type of capacitively coupled etch reactor. In the beginning, a capacitively coupled etch reactor employed a single RF bias power supply coupled to the wafer. In such a reactor, the etch rate could only be increased (to enhance productivity) by increasing the RF power. Such an increase unfortunately increases the ion energy, causing more bombardment damage to photoresist and thereby reducing etch selectivity. This problem was circumvented by introducing magnetic fields at the sides of the chamber (in lieu of increasing the RF power) to improve the etch rate, in which case the reactor is called a magnetically enhanced reactive ion etch (MERIE) reactor. This approach was successful in improving the etch rate without damaging the photoresist or reducing the etch selectivity. The magnetic field boosts the etch rate by increasing ion dissociation. Recently, the RF source power has been decoupled from the ion energy by applying VHF source power that contributes primarily (or almost exclusively) to ion density while applying independently a low frequency (or HF frequency) bias power that contributes primarily (or almost exclusively) to ion energy. This permits ion density to be increased, without increasing ion bombardment damage to photoresist, by increasing the VHF source power without increasing the lower frequency bias power. Nevertheless, even with such dual or triple frequency approaches for decoupling control of ion density and ion energy, MERIE magnets are found to be an essential feature for enhancing etch performance. The problem is that the MERIE magnetic fields tend to have their greater etch rate-enhancing effect near the wafer edge. This produces a center-low etch rate distribution across the wafer surface, which has seemed to be an unavoidable characteristic of MERIE reactors. Typically, the MERIE reactor also suffers from the effects (discussed above) of low gas residency time over the wafer center, that causes center-low etch rate distribution. The relatively high dissociation achieved in such a reactor, through the use of VHF source power and MERIE magnets makes the non-uniformity of the dissociation (due to non-uniform gas residency time across the wafer) more critical.

SUMMARY OF THE INVENTION

A plasma etch reactor for plasma enhanced etching of a workpiece such as a semiconductor wafer includes a housing defining a process chamber, a workpiece support configured to support a workpiece within the chamber during processing and comprising a plasma bias power electrode. The reactor further includes a first process gas inlet coupled to receive predominantly or pure oxygen gas and a second process gas inlet coupled to receive a polymerizing etch process gas. The reactor has a ceiling plasma source power electrode including a center circular gas disperser configured to receive a process gas from the first process gas inlet and to distribute the process gas into the chamber over the workpiece, and an inner annular gas disperser centered around the center gas disperser configured to receive the process gas from the second process gas inlet and to distribute the process gas into the chamber over the workpiece through an inner plurality of injection ports.

DETAILED DESCRIPTION OF THE INVENTION

The present invention solves the problem of center-low etch rate and tapered etch profile at the wafer center that has plagued capacitively coupled plasma etch processes for etching dielectric thin films. The invention is based upon our surprising discovery that the problem can be completely solved without requiring any increase in etch process gas flow rate over the wafer center. It is further based upon our discovery that removing or slowing deposition of polymer on sidewalls of narrow openings at the wafer center during the etch process is the only effective solution, rather than attempting to change the etch gas flow rate at the wafer center. Finally, the invention is based upon our surprising discovery that a gas such as oxygen which does not etch dielectric material, but which does reduce the amount of deposited polymer, is an essential part of this solution. Such a gas is referred to herein as a polymer-retarding gas. The invention is realized by providing a novel independent gas injection orifice or zone at the center of the overhead electrode that is supplied with the polymer retarding gas (pure oxygen) with a flow rate adjustment independent of the polymerizing etch process gas flow to the inner/outer gas zones of the ceiling electrode/gas showerhead. The purpose of this new feature is to inject the polymer retarding gas (pure oxygen) primarily (or exclusively) onto the wafer center, without necessarily having to alter the gas distribution of the etchant (fluorocarbon or fluorohydrocarbon) gases in the chamber. The surprising result is that the additional gas flow over the wafer center (i.e., the added oxygen gas), which would be expected to reduce etch rate at the wafer center by reducing gas residency time, actually increases etch rate as high as desired, depending upon the oxygen gas flow rate to the center. In fact it was discovered that the dielectric etch rate at the wafer center can be increased to a level higher than any other location on the wafer, if desired, by simply increasing the oxygen flow (influx) rate at the wafer center. Thus, the effect of the oxygen gas in suppressing polymer growth at the wafer center during etch (thereby solving the etch-stop problem) outweighs the effect of increased gas flow on residency time or dissociation. Another advantage is that the photoresist etch rate (caused by ion bombardment during the dielectric etch operation) can be made more uniform by adjusting the polymer retarding gas (oxygen) flow rate over the wafer center.

Figure 1A:
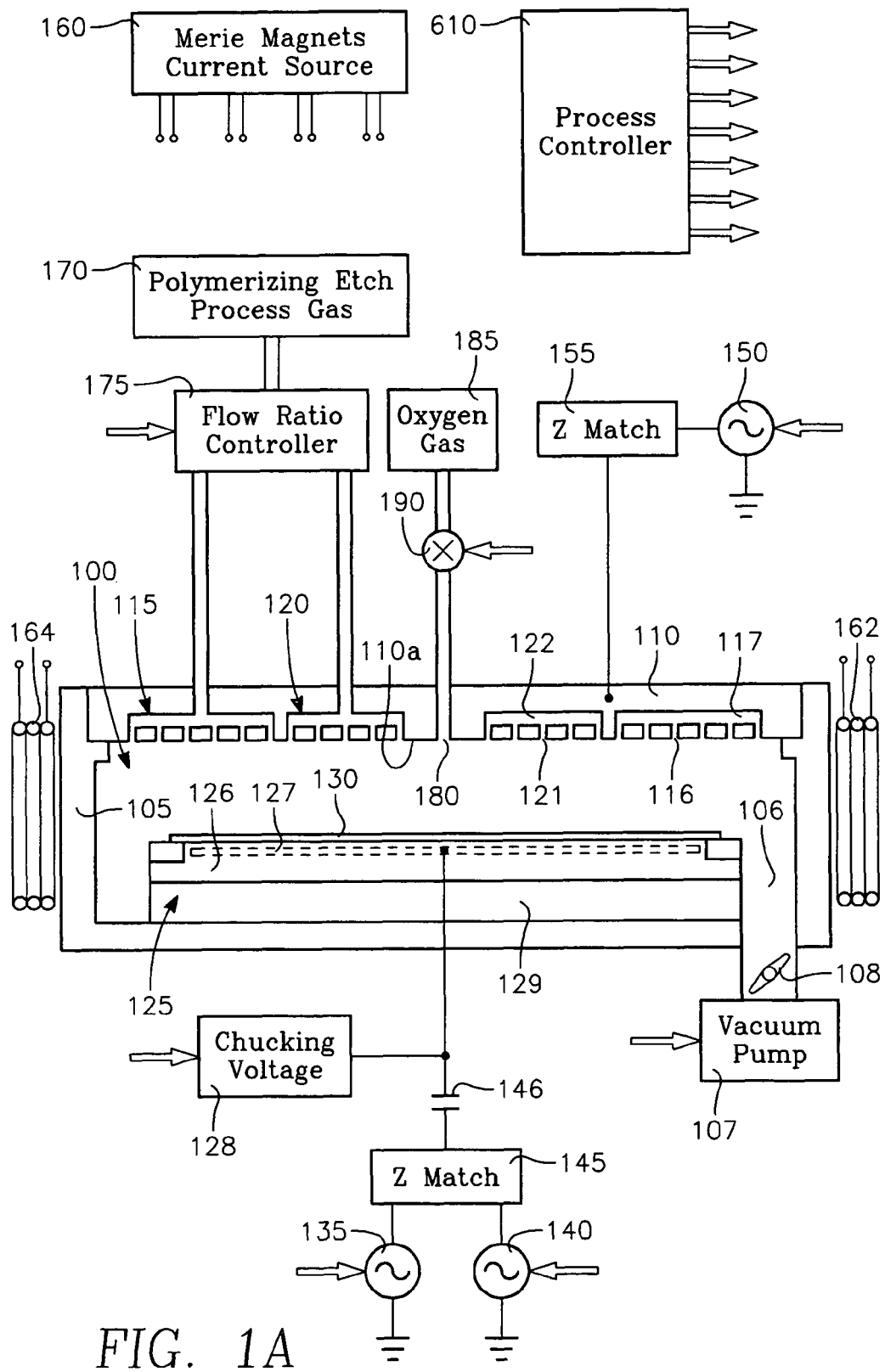
FIGS. 1A and 1B are side and top views of a plasma reactor having features for carrying out a process of the invention.

FIG. 1A depicts a capacitively coupled plasma reactor that includes features for carrying out the process of the invention. The reactor of FIG. 1A includes a chamber 100 defined by a cylindrical side wall 105 supporting an overhead electrode 110. The overhead electrode 110 is both an electrode and a gas distribution showerhead having an outer annular zone 115 of gas injection orifices 116 in the electrode bottom surface 110a fed from a common outer manifold 117 inside the electrode 110, and an inner annular zone of 120 of gas injection orifices 121 in the electrode bottom surface 110a fed from a common inner manifold 122 inside the electrode 110.

An electrostatic chuck (ESC) 125 supports the semiconductor wafer 130 that is to be etched. The ESC 125 has an insulating layer 126 containing a chucking electrode or grid 127 and a lower conductive base layer 129 that may be cooled. The ESC surface supporting the wafer is about one inch below the ceiling electrode bottom surface 110a, which establishes a high aspect ratio for a large (300 mm) wafer diameter. A D.C. chuck voltage supply 128 is connected to the ESC grid 127. Plasma bias power is applied by a high frequency (HF) RF generator 135 and/or a low frequency (LF) RF generator 140 through an impedance match circuit 145 through an isolation capacitor 146 to the ESC grid 127. Plasma source power is applied by a very high frequency (VHF) RF generator 150 through an impedance match element 155 to the ceiling electrode 110.

The ESC 125 and the side wall 105 define a pumping annulus 106 between them through which gas is evacuated from the chamber interior by a vacuum pump 107. A throttle valve 108 regulates the evacuation rate and chamber pressure.

In one type of such a reactor, the impedance match element 155 is a coaxial tuning stub. This type of reactor is disclosed in U.S. Pat. No. 6,838,635 by Daniel Hoffman, et al. and assigned to the present assignee. Preferably, the tuning stub has a resonant frequency near the frequency of the VHF generator 150 which is near a resonant frequency formed by plasma in the chamber 100 and the ceiling electrode 110. For this purpose, the ceiling electrode reactance may be tuned to provide a resonance with the plasma near the VHF generator frequency.

Figure 1B:
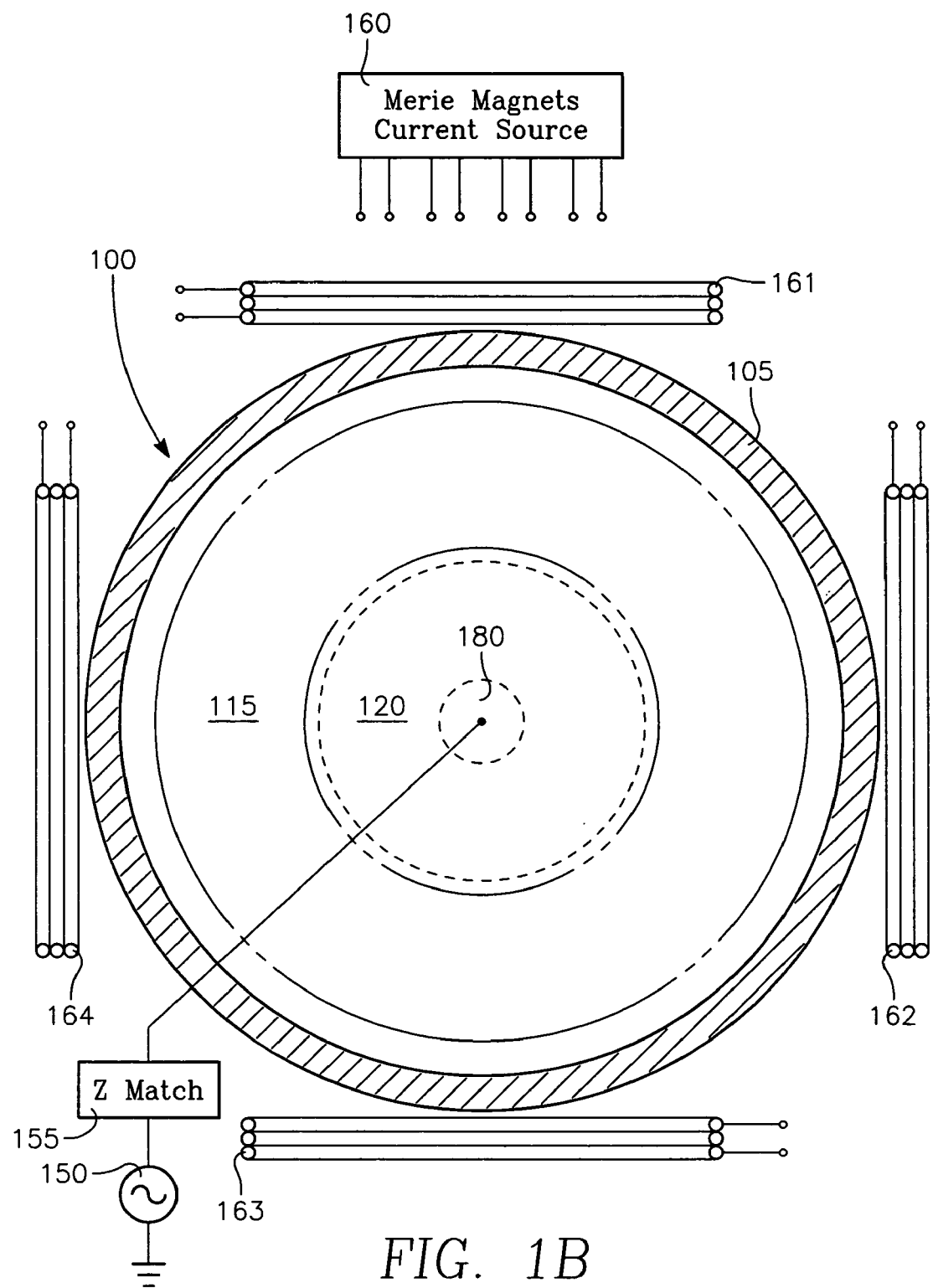

In another type of capacitively coupled reactor, the impedance match element 155 is a conventional circuit. In either type of reactor, etch performance can be enhanced by magnetically enhanced reactive ion etch (MERIE) electromagnets 161, 162, 163, 164 (shown in FIG. 1B) disposed around the sidewall 105 and driven by successively phased low frequency currents to produce a slowly rotating magnetic field in the chamber 100. The currents are provided by an MERIE current source 160. The sidewall 105 may be formed of a non-magnetic conductor such as aluminum.

Figure 1C:
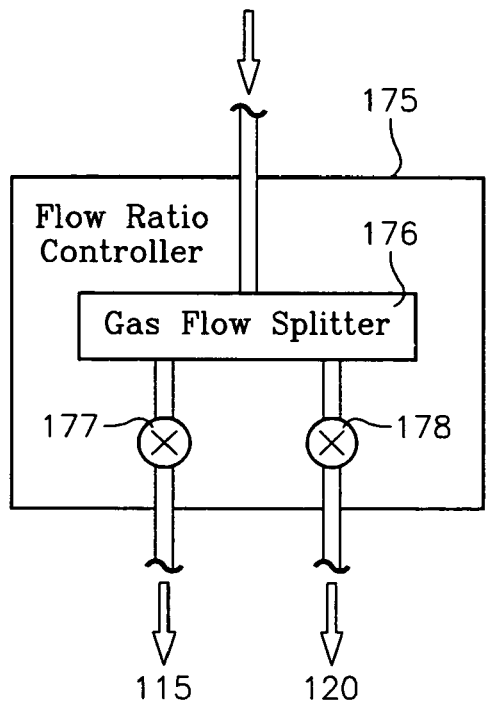
FIG. 1C depicts a gas flow splitter employed in the reactor of FIGS. 1A and 1B.

A process gas supply 170 furnishes a process gas that includes, as its main component, polymerizing etch gases (e.g., a fluorocarbon and/or fluorohydrocarbon gases) to a flow ratio controller (FRC) 175 which apportions the gas flow to the inner and outer gas manifolds 122, 117 of the inner and outer gas orifices 120, 115 of the ceiling electrode 110. (The FRC 175 is depicted in FIG. 1C and consists of a gas flow divider or splitter 176b and a pair of control valves 177, 178 coupling the splitter 176 to the two manifolds 117, 122 respectively.)

Conventionally, the problem of low etch rate or etch stop at the wafer center was addressed by decreasing process gas flow to the inner zone 120 or increasing gas flow at the outer zone 115. Such an expedient is supposed to increase dissociation at the wafer center and/or reduce it at the edge. However, the change in dissociation at the wafer center (for example) is not enough to overcome the non-uniform distribution of polymer composition (i.e., carbon-rich polymer at the center and carbon-lean polymer at the edge). The problem is observed in the etch profile of a deep narrow opening depicted in FIG. 2A. It is desired to form the same identical opening at both the wafer center (left side of FIG. 2A) and at the wafer periphery (right side of FIG. 2A). However, as described above, the gas residency time and (hence) the dissociation are much greater at the wafer periphery, so that more active species (simpler compounds of fluorine) are present at the wafer edge, thereby slowing the polymer deposition at the wafer periphery and preventing it from filling in the narrow opening before the opening is etched to the desired depth and dimension. The result at the wafer edge is a top critical dimension (TCD) at the top of the opening and a bottom critical dimension (BCD) at the bottom of the opening that are within the desired range, the opening being of the desired depth (right side of FIG. 2A). In contrast, at the wafer center (left side of FIG. 2A), the high carbon content of the polymer deposited on the side wall of the high aspect ratio opening causes the opening to be very narrow at its bottom, forming a BCD that is too small, and the hole depth to be insufficient, due to etch stop at the wafer center.

Figures 2A, 2B:
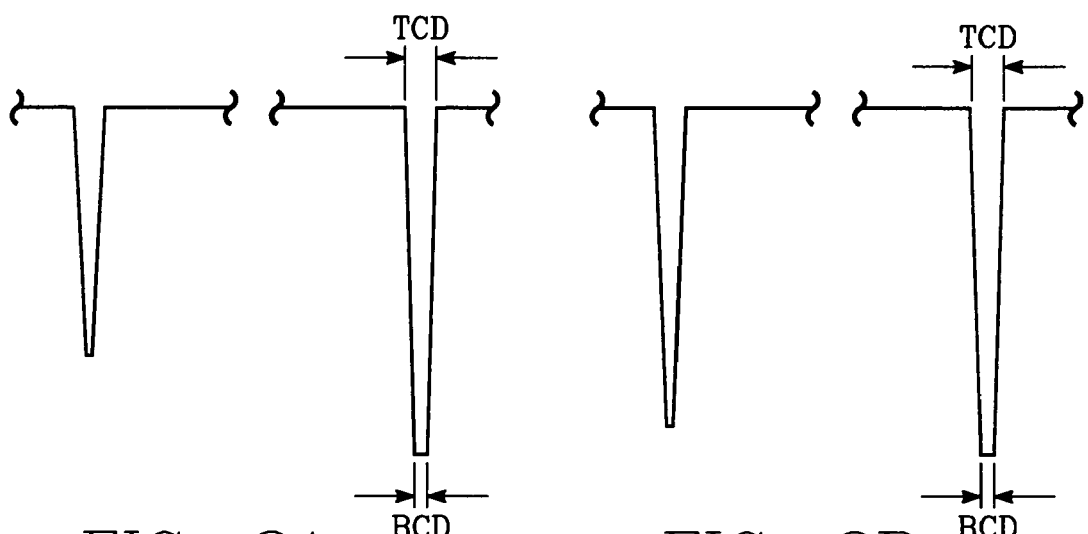
FIGS. 2A and 2B depict center and edge etch profiles obtained in a conventional process and obtained in a process of the invention, respectively.

The problem is solved by flowing pure oxygen gas to the wafer center through a center gas injection zone 180. The center gas injection zone 180 may be a single gas injection orifice (or plural orifices), in the center of the ceiling electrode 110. The center gas injection zone 180 receives the oxygen gas from an oxygen gas supply 185 that is independent or separate from the polymerizing etch gas supply 170. A control valve 190 controls the flow rate of the oxygen gas to the center gas injection zone 180. FIG. 2B depicts the successful results obtained using the center gas injection zone 180, in which the deep narrow opening at the wafer center (left side of FIG. 2B) has the approximately same BCD and depth as the narrow opening at the wafer periphery (right side of FIG. 2B). The flow rate of the pure oxygen through the center gas injection zone 180 is increased using the control valve 190 until reaching a threshold at which the etch process produces a BCD at the wafer center is about the same as the BCD at the wafer edge. This threshold is determined prior to performing the process by etching successive test wafers at successively different flow rates of oxygen gas through the center zone 180 and measuring the BCD's at the center and periphery of each of the successive wafers, and noting which one had little or no deviation in BCD between the wafer periphery and center. Alternatively (or in addition), anyone or all of the following measurements may be taken to compare the following etch parameters between the wafer periphery and center: etch profile, etch depth, bottom critical dimension (BCD). The oxygen flow rate threshold deduced from the data is one that renders uniform the radial distribution of any one or a combination of BCD, etch depth or etch profile, depending upon the measurements selected. Using the threshold oxygen flow rate determined in this manner, non-uniformities are eliminated (or reduced) in the invention. An additional advantage is the elimination of excess over-etching near the wafer edge, which (prior to the present invention) was a necessary consequence of extending the etch process time sufficiently to gain a slight increase in BCD at the wafer center. The overall production throughput is therefore increased.

In one successful implementation, it was unnecessary to flow process gas to the outer zone 115, so that only the inner zone 120 and the center gas injection zone 180 were used.

Figure 3:
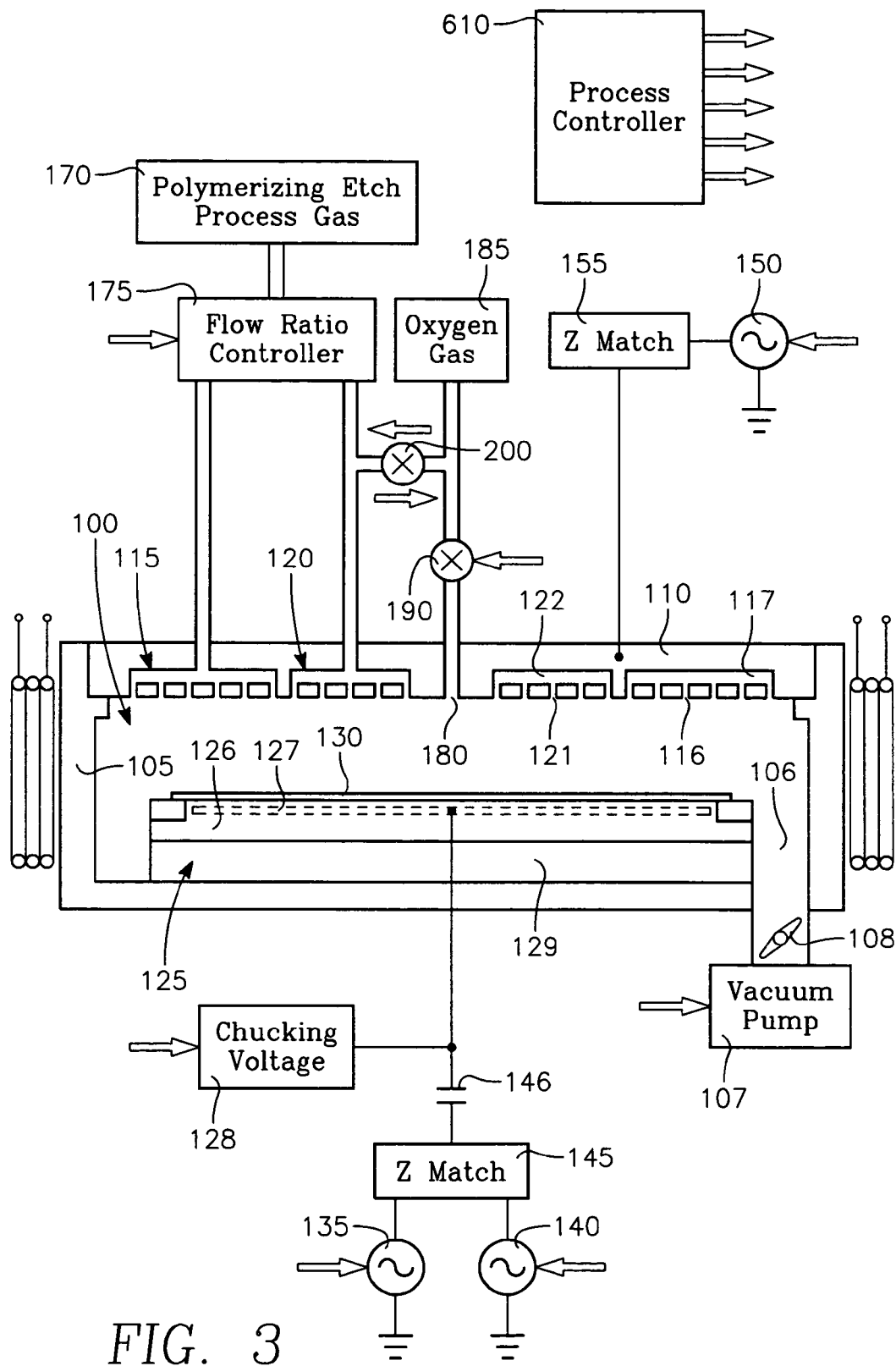
FIGS. 3 and 4 depict different gas distribution apparatus for the reactor of FIG. 1A for carrying out different embodiments of a process of the invention.

In the implementation depicted in FIG. 3, some of the oxygen from the oxygen supply 185 may be diverted through a valve 200 to the inner gas zone 120.

Figure 4:
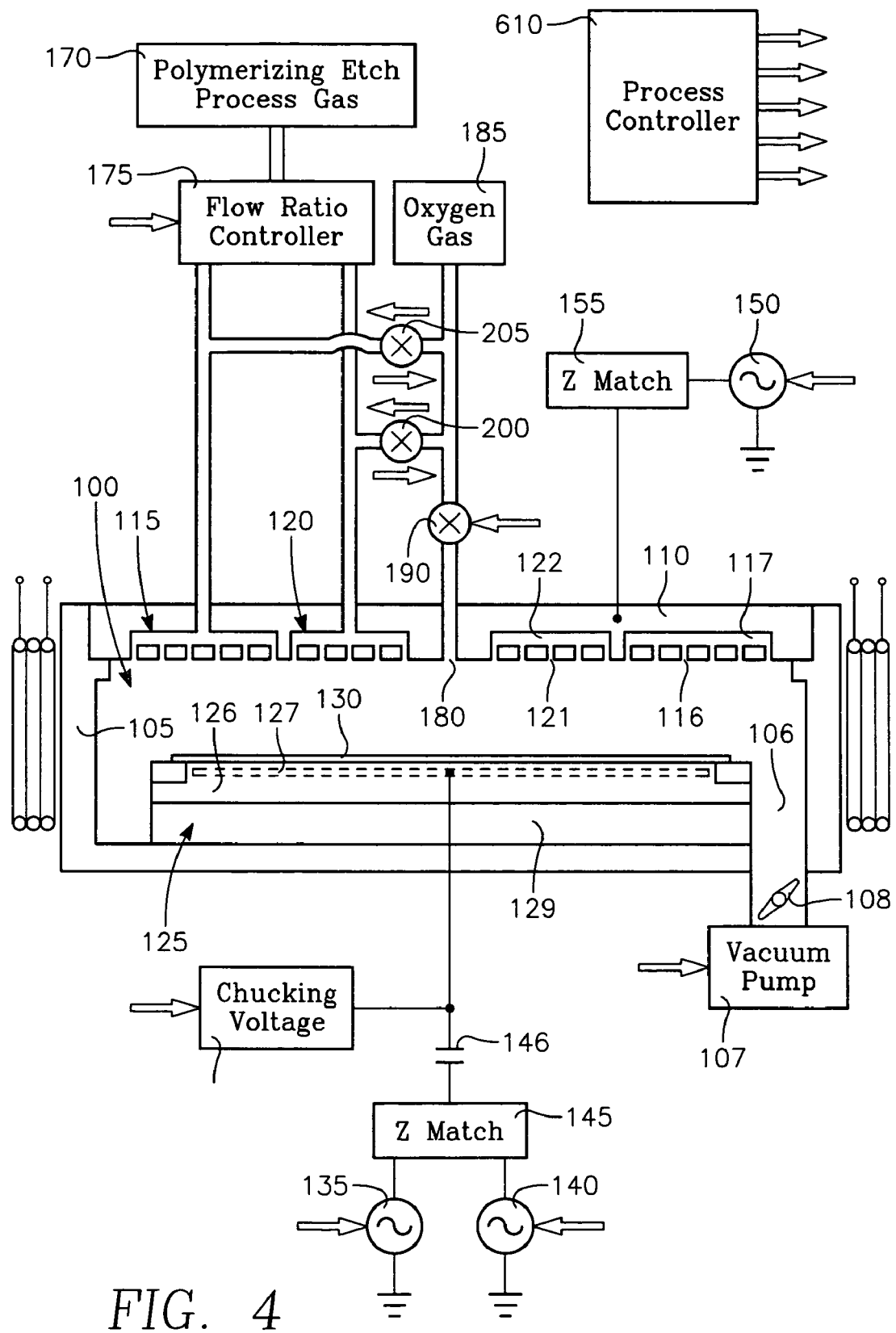

In the implementation of FIG. 4, some of the oxygen from the oxygen supply 185 may be diverted through a valve 205 to the outer gas zone 115 (in addition to being diverted to the inner gas zone 120).

Thus, in the implementation of FIG. 3 or FIG. 4, oxygen gas flow rate radial distribution can be broadened or narrowed, as desired, to increase or decrease the oxygen gas flow rate to the inner and/or outer gas zones 120, 115. Specifically, in each of the inner and outer gas injection zones 120, 115, a different ratio between the polymerizing etch process gas and the pure oxygen gas may be selected to optimize uniformity of the radial distribution of a selected etch parameter (BCD, etch depth or etch profile). In one embodiment, the oxygen gas is injected through only the inner and outer annular gas injection zones 120, 115 and none through the center orifice 180. In this case, the increase in oxygen gas flow rate sufficient to render uniform the radial distribution of the selected etch parameter (BCD, etch depth, etch profile) is carried out in the inner annular gas injection zone 120. This latter step has the effect of increasing the ratio of oxygen gas to polymerizing etch process gas in the inner gas injection 120 zone over the same ratio in outer gas injection zone 115. We have found that this increase varies depending upon the reactor design, the composition of the thin film being etched, the process recipe, RF power levels, etc., and therefore can only be determined empirically by the etching of successive test wafers at different oxygen flow rates. Such an empirical determination may be carried out by initially setting the oxygen flow rates in the inner and outer gas injection zones 120, 115 to the same level. For each test wafer, the inner zone oxygen gas flow rate is increased to a different level, the etch process carried out, and the selected etch parameter measured at center and periphery of that wafer. We have found that the increase in oxygen flow rate to the inner gas injection zone 120 relative to the flow rate in the outer gas injection zone 115 sufficient to reach process uniformity (of the selected etch parameter) is readily determined, and corresponds to a definite ratio between the final (higher) inner zone oxygen flow rate and the outer zone oxygen flow rate.

Figure 5A:
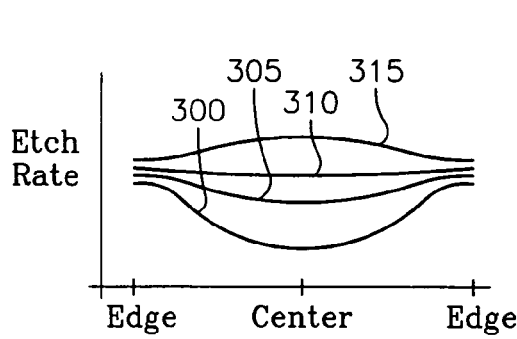
FIGS. 5A and 5B depict oxide and photoresist etch rate radial distributions obtained in a first embodiment of the invention.

FIG. 5A is a graph qualitatively comparing radial distributions of dielectric etch rates obtained in plasma etch processes with and without the invention. The results of FIG. 5A were obtained by etching a dielectric thin film layer of silicon dioxide in a capacitively coupled plasma reactor of the type depicted in FIG. 1A. The curve labeled 300 depicts a typical silicon dioxide etch rate as a function of radial location on the wafer in the case in which a polymerizing etch gas is fed through the inner zone gas injection orifices 120 with no oxygen gas (or any other gas) fed through the center gas injection zone 180. The curve 300 indicates that the etch rate is depressed at the wafer center, as expected in such a conventional capacitively coupled etch process. The curve labeled 305 depicts the oxide etch rate as a function of radial location under the same process conditions in which the curve 300 was obtained, with the addition of a modest flow rate of oxygen gas at the center gas injection zone 180. The curve 305 indicates that the oxygen gas injected through the center gas injection zone 180 causes the etch rate at the wafer center to increase somewhat, although the etch rate remains somewhat depressed at the wafer center. The curve labeled 310 depicts the oxide etch rate as a function of radial location under the same process conditions but with a significantly higher oxygen gas flow rate through the center gas injection zone 180. The curve 310 indicates that the higher oxygen flow rate through the center orifice is sufficient to raise the etch rate at the wafer center to at least nearly equal the etch rate near the wafer periphery, so that the etch rate distribution is far more uniform. The curve 315 depicts the oxide etch rate as a function of radial location under the same process conditions except that the oxygen gas flow rate through the center gas injection zone 180 is increased even further (above that used to obtain the curve 310). The curve 315 indicates that the etch rate radial distribution is center high when the oxygen gas flow rate through the center gas injection zone is very high. These results indicate that the user may increase the oxygen gas flow rate through the center zone 180 to an ideal level at which the most uniform etch rate radial distribution is attained, corresponding to the curve 310. The uniform dielectric etch rate distribution of the curve 310 corresponds to the ideal etch profile distribution depicted in FIG. 2B in which the bottom critical dimension (BCD) at the wafer center is nearly as great as the BCD at the wafer edge.

Figure 5B:
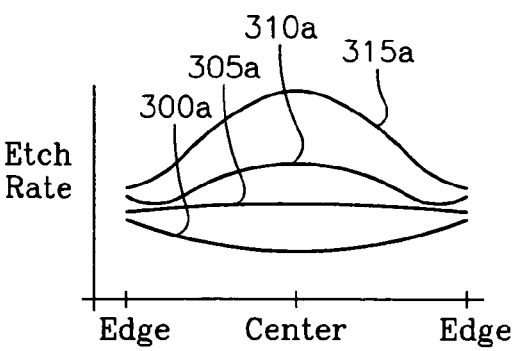

The dielectric plasma etch process is performed with a photoresist mask overlying the dielectric film, and the photoresist mask is etch by ion bombardment in the plasma (simultaneously with the etching of the dielectric thin film layer), which removes some of the photoresist during the etch step. As long as this removal merely reduces the photoresist mask thickness without removing the mask, it is acceptable. However, because partial photoresist removal can affect TCD and BCD, it is desirable that the photoresist etch rate have a radial distribution that is as uniform as possible. FIG. 5B is a graph depicting the photoresist etch rate distribution obtained in the process conditions corresponding the dielectric etch rate curves 300, 305, 310 and 315 of FIG. 5A. The curves labeled 300a, 305a, 310a and 315a of FIG. 5B depict the photoresist etch rate distributions obtained in the etch steps represented by the dielectric etch rate curves 300, 305, 310 and 315, respectively, of FIG. 5A. FIG. 5B shows that the photoresist etch rate distribution is much more responsive to the oxygen flow rate through the center gas zone 180. Specifically, an ideal oxygen flow rate through the center zone 180 corresponds to the uniform dielectric etch rate distribution represented by the curve 310 of FIG. 5A, and to the center high photoresist etch rate represented by the curve 310a of FIG. 5B. A higher oxygen gas flow rate through the center gas zone 180 produces a slightly center high dielectric etch rate represented by the curve 320 of FIG. 5, and to the much more center high photoresist etch rate represented by the curve 320a of FIG. 5B. The results illustrated in FIGS. 5A and 5B show that the response of the etch rate distribution to the flow rate oxygen gas through the center gas zone 180 is very sensitive, so that the center zone oxygen gas flow rate should be adjusted with great care to obtain the most uniform dielectric etch rate distribution without undue non-uniformity in the photoresist etch rate.

Figure 6A:
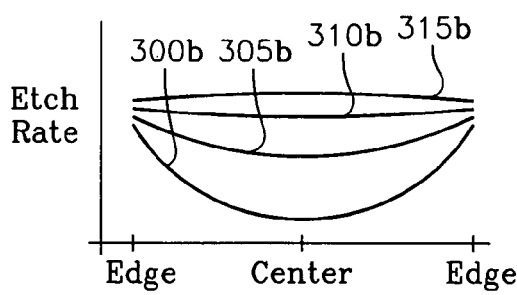
FIGS. 6A and 6B depict oxide and photoresist etch rate radial distributions obtained in a second embodiment of the invention.
Figure 6B:
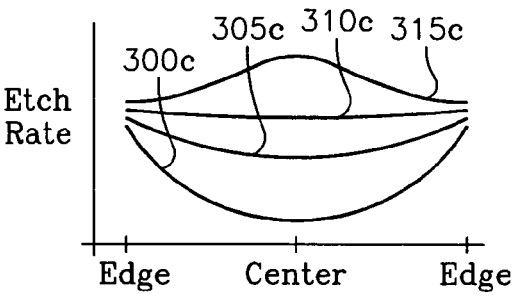

A less sensitive response by the etch rate distribution to oxygen gas flow over the wafer center may be obtained in another embodiment of the invention in which the entire gas distribution pattern is shifted radially outwardly. Specifically, the oxygen gas is fed through the inner gas zone 120 while the polymerizing etch process gas is fed through the outer gas zone 115. In this case, very little (or no) oxygen gas is fed through the center gas injection zone 180. This may be accomplished by employing the embodiment of FIG. 3, in which the only gas fed to the inner zone is oxygen from the oxygen gas supply 185 while the only gas fed to the outer zone is the etch process gas (e.g., a fluorocarbon or fluorohydrocarbon gas) from the etch process gas supply 170. For this purpose, the FRC 175 can shut off the flow of etch gas to the inner gas zone 120, and the center zone gas flow is likewise turned off at the valve 190. This embodiment retains the same approach as the preferred embodiment of FIG. 1A in that oxygen gas flow is directed to the wafer center to reduce the deposition of polymer at the wafer center, while the polymerizing etch process gas is directed to the outer portion of the wafer. However, in this alternative embodiment, the oxygen gas distribution is not as concentrated at the wafer center. The resulting response of the dielectric etch rate distribution, illustrated in FIG. 6A, is a more moderate behavior, in which the successive dielectric etch rate distributions 300b, 305b, 310b, 315b arising from successively higher oxygen gas flow rates exhibit more gradual increase in dielectric etch rate at the wafer center. Similarly, in FIG. 6B the corresponding photoresist etch rate distributions 300c, 305c, 310c, 315c arising from the successively higher oxygen gas flow rates exhibit a more gradual increase in dielectric etch rate at the wafer center, with only the highest oxygen gas flow rate resulting in a center high photoresist etch rate distribution (the curve 315c of FIG. 6B).

The sensitivity of the etch process to adjustments in the oxygen flow rate to the wafer center may be adjusted between the highly sensitive behavior of FIG. 5A and the moderate behavior of FIG. 6A by combining the features of the two embodiments. Specifically, some of the oxygen gas may be directed to the center gas zone 180 and the remainder directed to the inner gas zone 120, while some of the polymerizing etch process gas may be directed to the outer gas zone 115 and the remainder directed to the inner gas zone 120. The apportionment of these gases between the alternative paths determines how closely the process follows the sensitive behavior of FIG. 5A or the moderate behavior of FIG. 6A.

Figure 7:
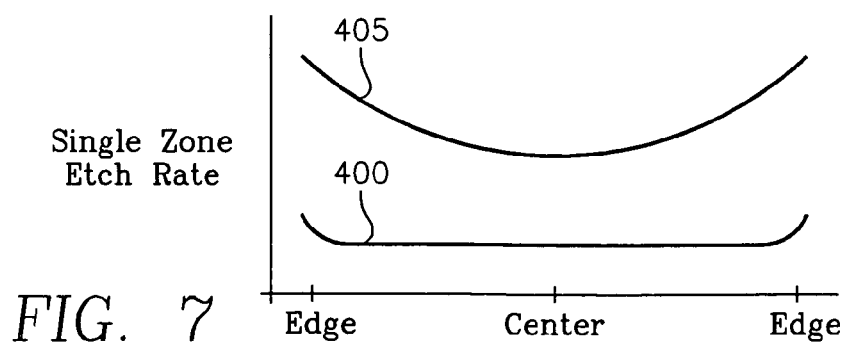
FIG. 7 is a graph depicting the effect of MERIE magnetic fields upon etch rate distribution.

FIG. 7 depicts how the pronounced center-low etch rate distributions of the curves 300 and 300a of FIGS. 5A and 6A are affected by the MERIE fields of the reactor of FIG. 1A. Without the MERIE fields, the etch rate is low and the etch rate distribution is moderately center low (the curve 400 of FIG. 7) because of the greater process gas residency time at the wafer periphery referred to above. Application of the MERIE field raises the overall etch rate while at the same time increasing the non-uniformity (center-low shape) of the etch rate distribution (the curve 405 of FIG. 7), due to the proximity of the MERIE magnets to the wafer periphery. The center low etch rate distribution of the curve 405 is corrected in the manner described above by feeding pure oxygen gas to the center gas injection zone 180 and increasing its flow rate until a uniform etch rate distribution is provided.

Figure 8:
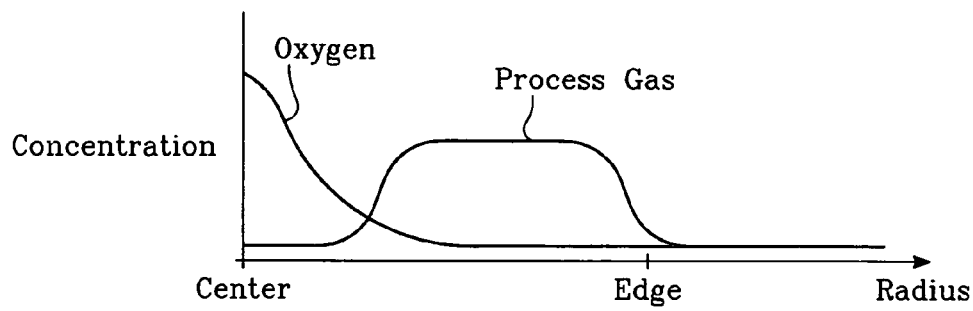
FIG. 8 is a graph of gas distribution patterns in a first embodiment of the invention.

FIG. 8 is a graph illustrating the radial distribution of gas concentration in the embodiment of FIG. 1A in which no gas is fed to the outer zone 115. In FIG. 8, the oxygen gas distribution (labeled "O2" in FIG. 8) is concentrated at the wafer center while the polymerizing etch process gas distribution (labeled "process gas" in FIG. 8) is fairly uniform but is somewhat center low and edge low.

Figure 9:
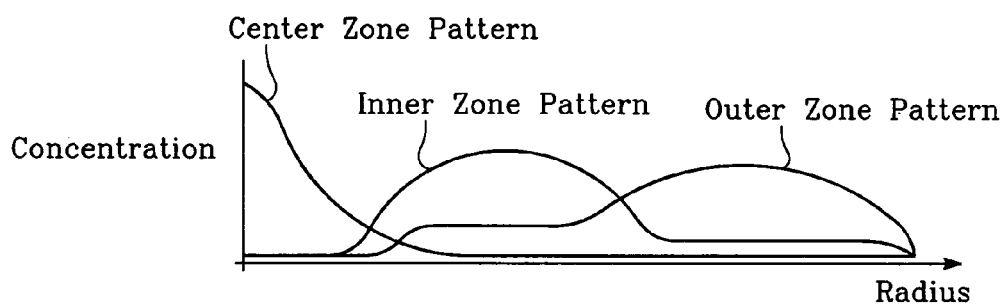
FIG. 9 is a graph of gas distribution patterns in a second embodiment of the invention.
Figures 10A, 10B, 10C:
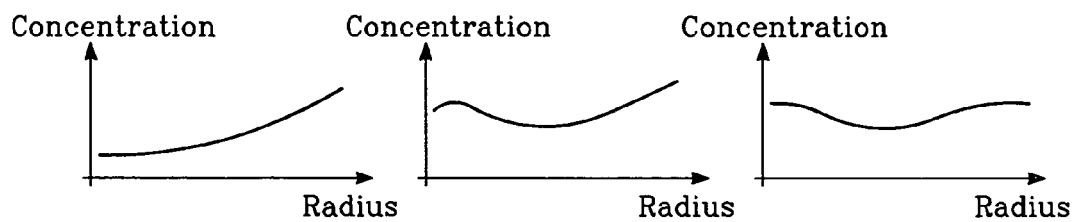
FIGS. 10A, 10B and 10C depict successively improved etch rate distributions obtained in accordance with successive steps for adjusting the etch process in accordance with an aspect of the invention.

FIG. 9 is a graph illustrating the radial distribution of gas concentration in the embodiment of FIG. 1A in which the oxygen gas is fed to the center zone 180, while polymerizing etch process gas is fed to both the inner zone 120 and the outer zone 115 independently. FIG. 9 shows that different gas distributions are obtained over the wafer center, middle and periphery, because each of the gas injection zones 115, 120, 180 has a different gas flow distribution pattern. These patterns are labeled in FIG. 9, respectively, "center gas distribution pattern", "inner zone pattern" and "outer zone pattern". Applying different gas flow rates to the three zones 115, 120, 180 enables the gas distribution of the oxygen gas and etch process gas to be optimized to provide the most uniform etch rate distribution. For example, a center low etch rate distribution (depicted in FIG. 10A) may be improved to a distribution having a center peak and an edge peak (depicted in FIG. 10B), by increasing the oxygen gas flow rate at the center gas zone 180. The etch rate distribution of FIG. 10B may have a dip or depression over the wafer middle, which may be lessened by adjusting the proportion of polymerizing etch process gas flow at the inner and outer zones 120, 115 (e.g., by increasing the inner zone flow rate relative to the outer zone flow rate) to obtain the more uniform distribution depicted in FIG. 10C.

The polymerizing etch process gases that can be employed in the process of the invention can be a mixture of C4F6, CH2F2. This mixture may be combined with O2 and Ar. Other polymerizing etch species that can be employed in similar mixtures include CHF3, CF4 and CH3F. With such gases, the process of the invention can be applied to the etching of silicon dioxide thin films and silicon nitride thin films, organo-silicate glass and nitrogen-doped silicon-carbon compounds, for example.

Figure 11:
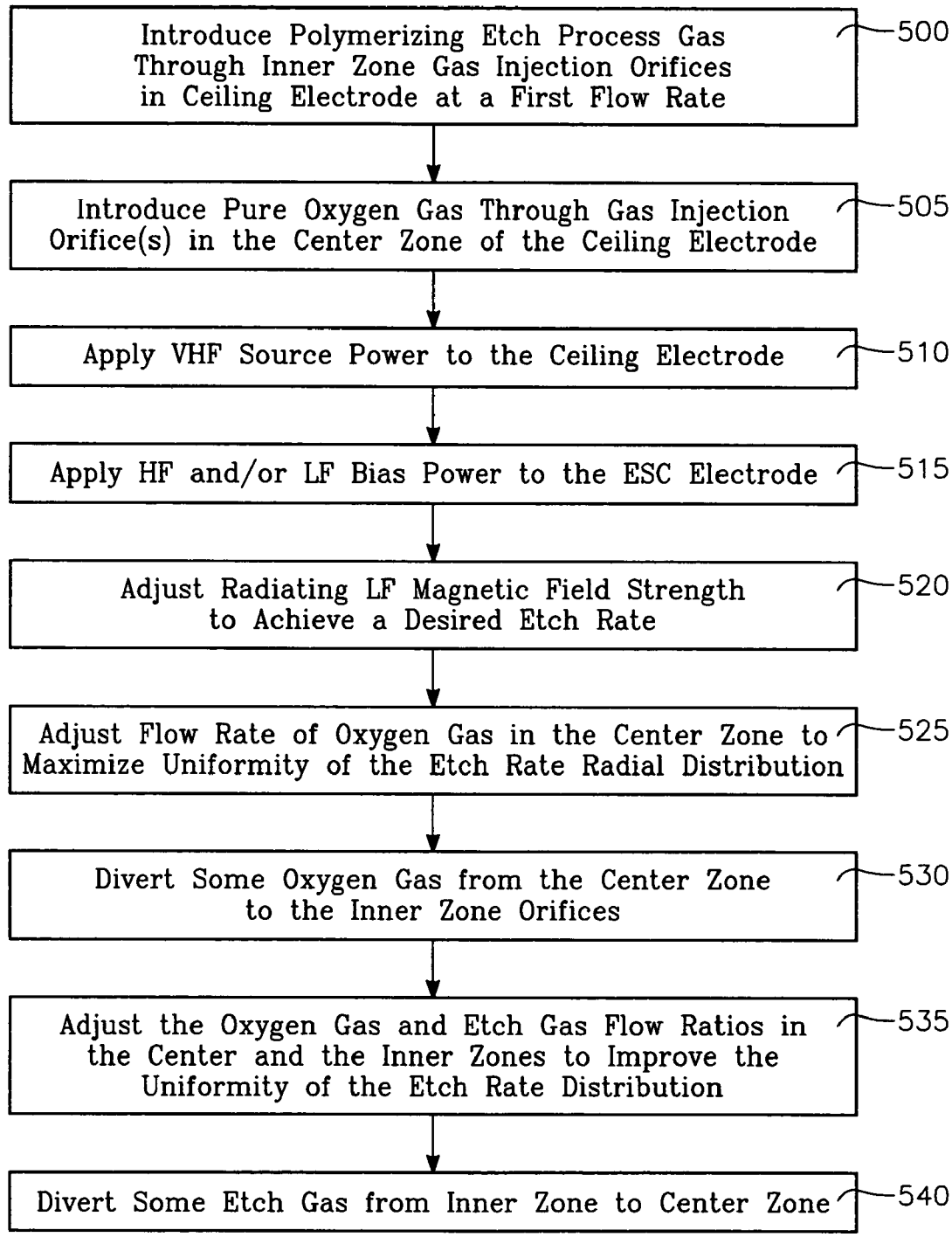
FIG. 11 is a block flow diagram of a first embodiment of a process of the invention.

FIG. 11 illustrates one process of the invention employing the reactor of FIG. 1A and using only the center and inner gas injection zones 180, 120. A polymerizing etch process gas is fed through the inner gas injection zone 120 of the ceiling electrode 110 (block 500 of FIG. 11). Oxygen gas is fed through the center gas injection zone 180 of the ceiling electrode 110 (block 505 of FIG. 11). VHF plasma source power (30 MHz to 400 MHz) is applied to the ceiling electrode 110 (block 510 of FIG. 11). RF plasma bias power is applied to the ESC grid 127 (block 515 of FIG. 11). The RF bias power may be either one or a combination of HF power (7 MHz to 30 MHz) and LF power (0.1 MHz to 4 MHz). If MERIE magnets are present, then the MERIE magnetic field is adjusted to provide a desired (enhanced) overall etch rate (block 520 of FIG. 11). The flow rate of the oxygen gas to the center gas zone 180 is adjusted (increased) to optimize or maximize the uniformity of the radial distribution of the dielectric etch rate (block 525 of FIG. 11). Specifically, the oxygen flow rate to the center zone 180 is increased until at level is reached at which dip at the wafer center in the radial distribution of etch rate or BCD (for example) is removed.

In an alternative embodiment that employs the apparatus of FIG. 3, some oxygen gas may be diverted from the center gas injection zone 180 and fed through the inner zone 120 (block 530 of FIG. 11). In this case, the ratio between the oxygen and etch gas flow rates in the inner zone may be adjusted to further enhance the uniformity of the dielectric etch rate radial distribution (block 535 of FIG. 11.

Figure 12:
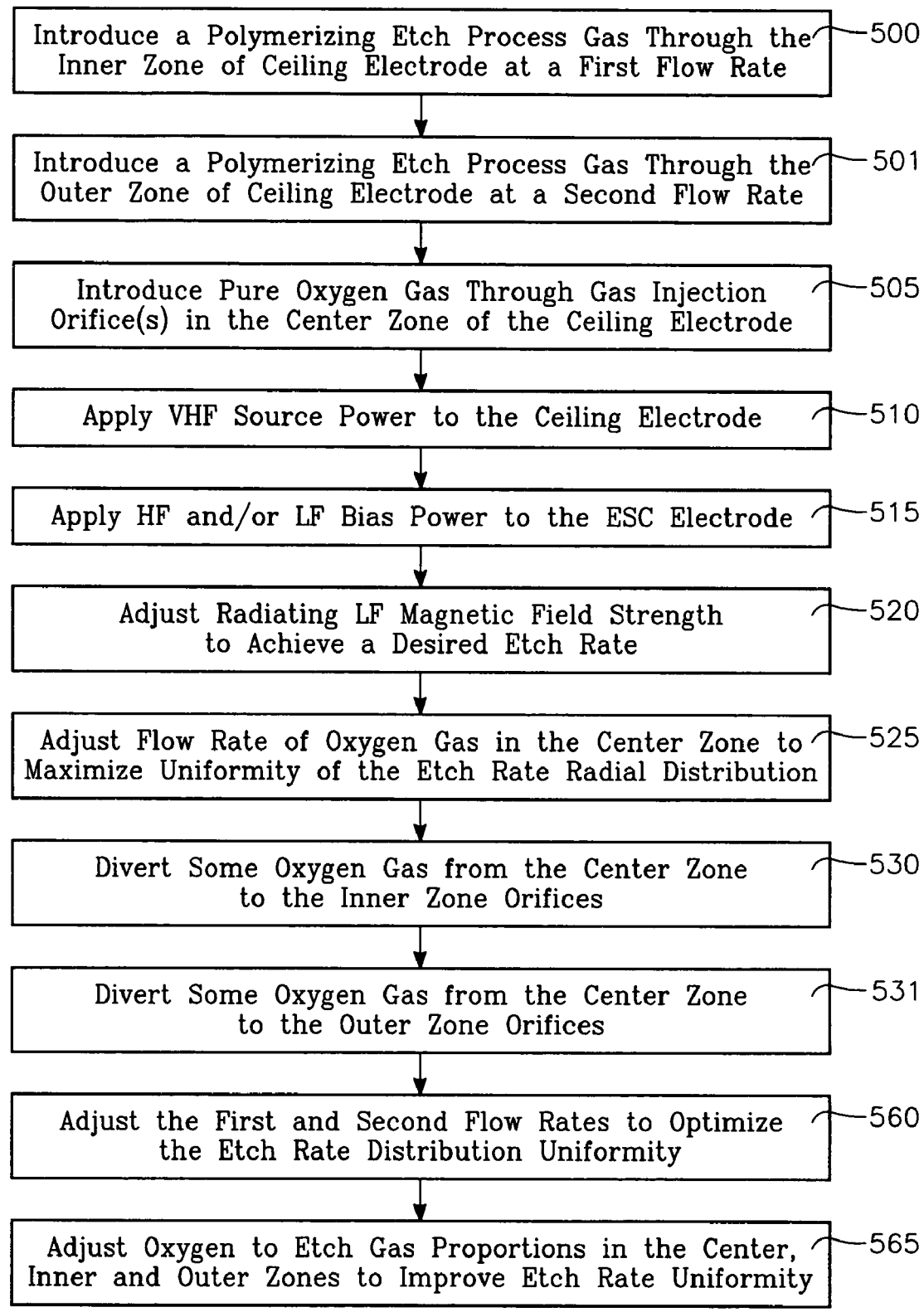
FIG. 12 is a block flow diagram of a second embodiment of a process of the invention.

FIG. 12 illustrates a process of the invention involving all three gas injection zones 115, 120, 180. It includes the steps of blocks 500 through 530 of FIG. 11. In addition, it includes the following steps: introducing a polymerizing etch process gas through the outer gas injection zone 115 (block 501 of FIG. 12); diverting some of the oxygen gas from the center zone 180 to the outer zone 115 (block 531); adjusting the inner and outer gas zone flow rates to improve etch rate uniformity across the wafer (block 560 of FIG. 12); and, adjusting the oxygen-to-etch process gas ratios in each of the center, inner and outer gas injection zones 180, 120, 115 to improve the dielectric etch rate radial distribution uniformity (block 565 of FIG. 12).

In order to carry out the foregoing processes, a process controller 610 individually controls the chucking voltage supply 128, the vacuum pump 107 and valve 108, the RF power levels of the RF generators 135, 140, 150, each of the valves 177, 178 of the flow ratio controller 175, the valve 190, the valve 200 in the embodiment of FIG. 3, and the valve 205 in the embodiment of FIG. 4. The process controller 610 may be programmable in that instructions for carrying out the process of FIG. 11 or FIG. 12 may be stored in the controller 190 for sequential execution by the controller 190.

While the invention has been described in detail by specific references to preferred embodiments, it is understood that variations and modifications thereof may be made without departing from the true spirit and scope of the invention.

What is claimed is:
1. A workpiece processing apparatus, comprising:
a housing defining a process chamber
a workpiece support configured to support a workpiece within the chamber during processing and comprising a plasma bias power electrode;
a supply of pure oxygen gas;
a supply of a polymerizing etch process gas;
a circular ceiling plasma source power electrode comprising:
  (1) a center gas disperser at the center of said ceiling and coupled to said supply of pure oxygen gas for distributing the oxygen gas over the center of the workpiece support;
  (2) an inner annular gas disperser concentric with said center gas disperser and coupled to said supply of polymerizing etch process gas for distributing polymerizing etch process gas over an annular portion of the workpiece;
  (3) an outer annular gas disperser centered around the inner annular gas disperser and coupled to said supply of polymerizing etch process gas, for distributing the polymerizing etch process gas over an outer annulus of the workpiece;

a bias power impedance match and an HF or LF bias power generator connected through said bias power impedance match to said workpiece support; and a VHF impedance match and a VHF plasma source power generator connected through said VHF impedance match to said ceiling electrode;

a flow ratio controller connected between said supply of polymerizing etch process gas and said inner and outer annular gas dispersers for separately controlling respective flow rates of polymerizing etch process gases to said inner and outer annular gas dispersers;

a flow rate control valve coupled to said center gas disperser and governing the flow rate of oxygen gas through said center gas disperser;

a first diversion valve coupled between said supply of pure oxygen gas and said inner annular gas disperser for governing a flow rate of oxygen gas to said inner annular gas disperser;

a second diversion valve coupled between said supply of pure oxygen gas and said outer annular gas disperser for governing a flow rate of oxygen gas to said outer annular gas disperser.

2. The apparatus of claim 1 wherein said center circular gas disperser is one of (a) a single gas injection orifice, (b) a circular array of gas injection orifices.

3. The apparatus of claim 1 further comprising a flow rate control valve connected between said supply of pure oxygen gas and said center gas disperser for governing the flow rate of oxygen gas through said center gas disperser.

4. The apparatus of claim 1 wherein said VHF source power generator has a frequency in excess of 60 MHz.

5. The apparatus of claim. 4 wherein said bias power generator has a frequency not exceeding about 13.56 MHz.

6. The apparatus of claim 5 further comprising a D.C. chucking voltage supply coupled to said bias power electrode, wherein said workpiece support comprises an electrostatic chuck.

7. The apparatus of claim 1 wherein said supply of polymerizing etch process gas contains at least one of (a) a fluorocarbon gas, (b) a fluorohydrocarbon gas, (c) a mixture of fluorocarbon species and fluorohydrocarbon species.

8. The apparatus of claim 1 wherein said flow ratio controller is adapted to separately control first and second ratios of oxygen gas to polymerizing etch process gas in said inner and outer annular gas dispersers, respectively.

9. The apparatus of claim 8 wherein said first ratio is greater than said second ratio.

* * * * *